(12) United States Patent
Yu et al.

(10) Patent No.: US 11,169,327 B2
(45) Date of Patent: Nov. 9, 2021

(54) HETEROGENEOUSLY INTEGRATED PHOTONIC CIRCUIT AND METHOD FOR MANUFACTURING THE CIRCUIT

(71) Applicant: Korea Advanced Institute of Science and Technology, Daejeon (KR)

(72) Inventors: Kyoungsik Yu, Daejeon (KR); Youngho Jung, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 0 days.

(21) Appl. No.: 16/984,808

(22) Filed: Aug. 4, 2020

(65) Prior Publication Data
US 2021/0018684 A1   Jan. 21, 2021

Related U.S. Application Data

(62) Division of application No. 16/366,534, filed on Mar. 27, 2019, now Pat. No. 10,768,367.

(30) Foreign Application Priority Data

Mar. 28, 2018   (KR) ........................ 10-2018-0035740

(51) Int. Cl.
  *G02B 6/132*   (2006.01)
  *H01L 21/50*   (2006.01)
  *G02B 6/12*    (2006.01)
  *G02B 6/122*   (2006.01)

(52) U.S. Cl.
  CPC .............. *G02B 6/132* (2013.01); *H01L 21/50* (2013.01); *G02B 6/12004* (2013.01); *G02B 6/1225* (2013.01); *G02B 2006/12061* (2013.01)

(58) Field of Classification Search
  None
  See application file for complete search history.

(56) References Cited

U.S. PATENT DOCUMENTS

| | | | | |
|---|---|---|---|---|
| 9,244,295 | B2 * | 1/2016 | Fujikata | G02F 1/225 |
| 9,583,650 | B1 * | 2/2017 | Yu | B82Y 10/00 |
| 2006/0261032 | A1 * | 11/2006 | Krishnamoorthy | G02B 26/0833 216/2 |
| 2012/0163749 | A1 * | 6/2012 | Huang | G02B 6/12004 385/3 |
| 2016/0027742 | A1 * | 1/2016 | Wen | H01L 24/14 257/620 |
| 2016/0158864 | A1 * | 6/2016 | Yu | C23C 18/1216 427/555 |
| 2018/0253002 | A1 * | 9/2018 | Shi | G03F 7/16 |

(Continued)

*Primary Examiner* — Jerry Rahll
(74) *Attorney, Agent, or Firm* — Fenwick & West LLP

(57) ABSTRACT

The method for manufacturing the heterojunction circuit according to one embodiment of the present disclosure comprises depositing a first electrode on at least a part of a waveguide, moving a semiconductor comprising a second electrode at a lower end thereof onto the first electrode, and depositing a third electrode on an upper end of the semiconductor, wherein the waveguide and the semiconductor comprise different materials. Additionally, the moving step further comprises generating microbubbles by supplying heat to at least a part of the semiconductor, moving the semiconductor on the first electrode by moving the generated microbubbles, and removing the microbubbles by positioning the semiconductor on the first electrode.

7 Claims, 10 Drawing Sheets

(56) References Cited

U.S. PATENT DOCUMENTS

2019/0267334 A1\* 8/2019 Bowers .................. H01L 24/73
2019/0302365 A1\* 10/2019 Yu ..................... H01L 31/03046

\* cited by examiner

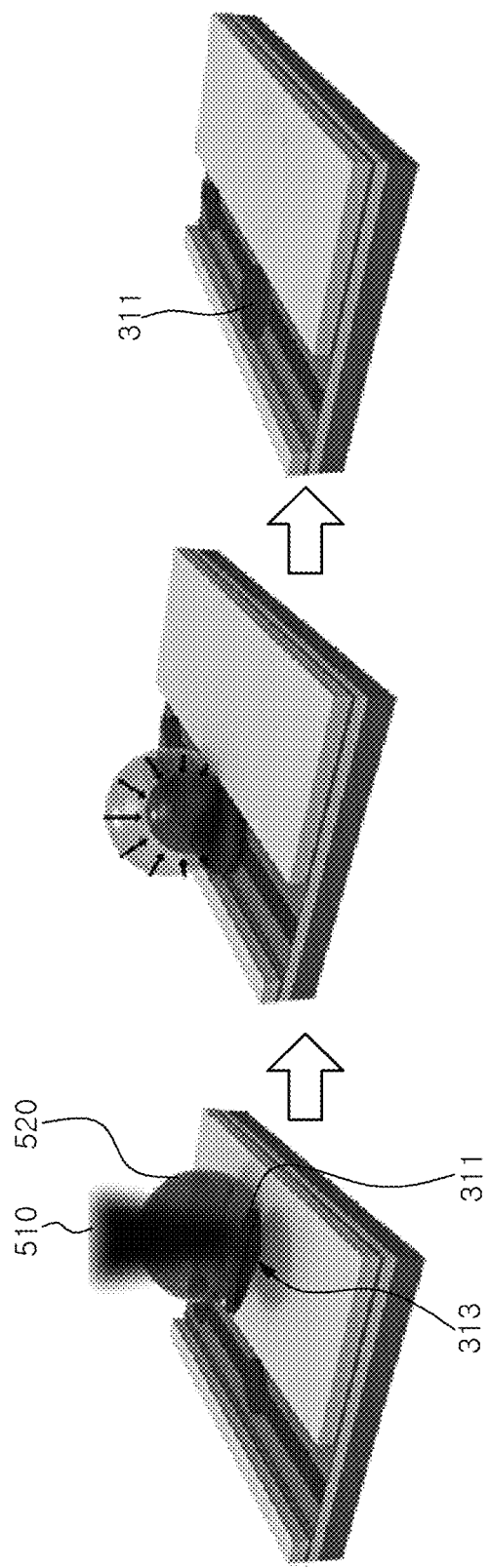

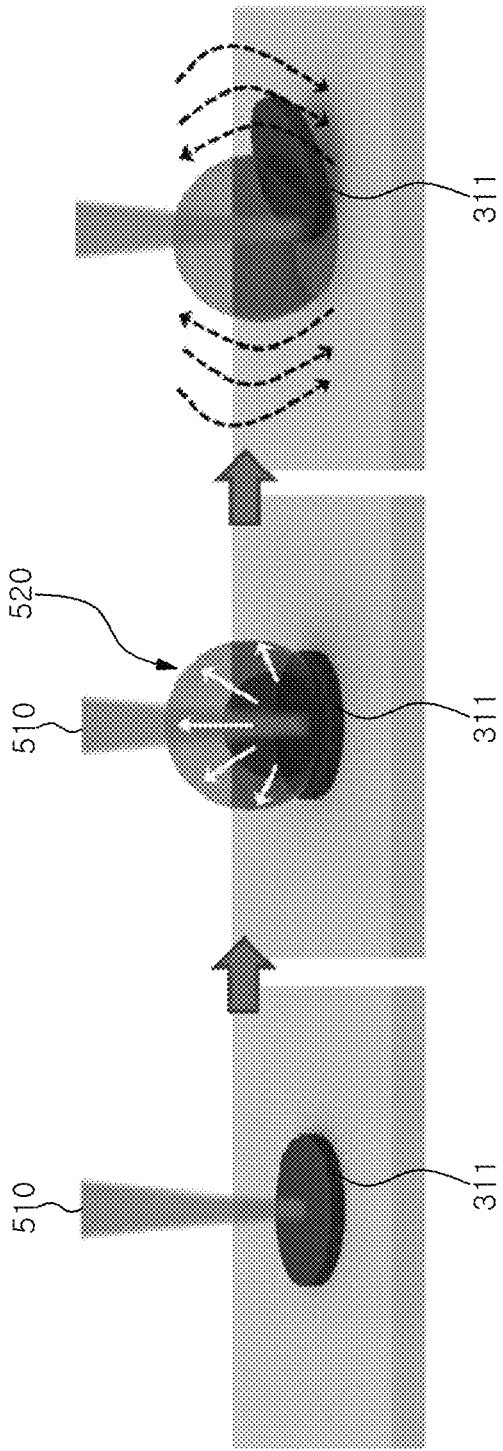

FIG. 7A
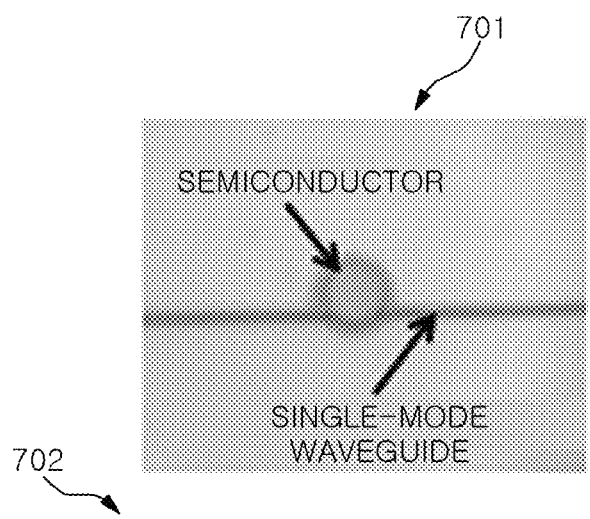
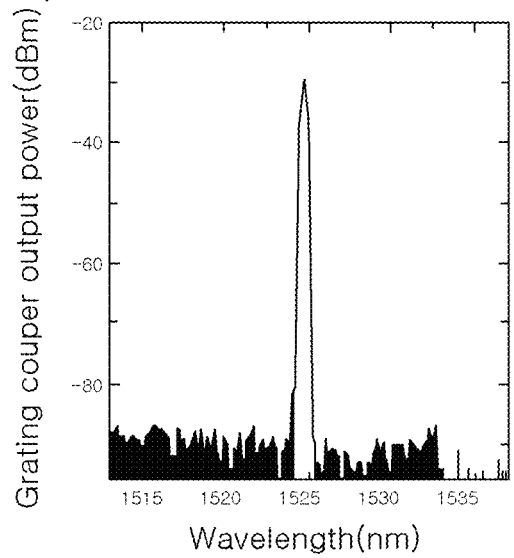
FIG. 7B
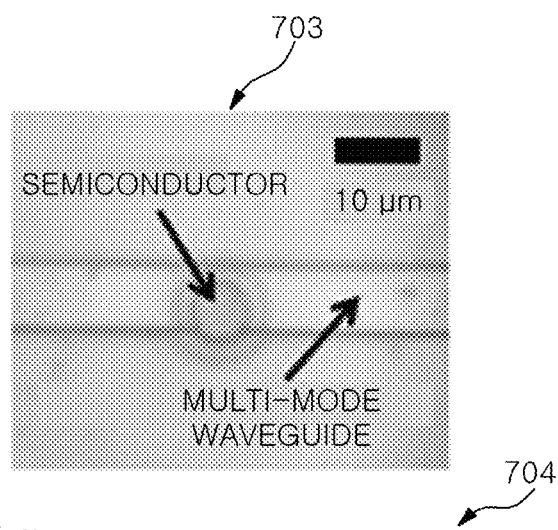
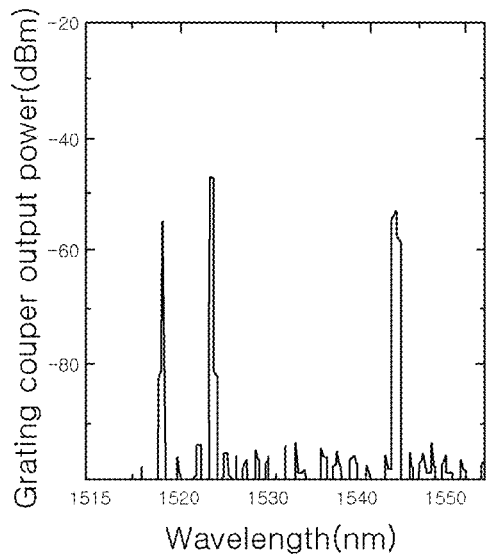

HETEROGENEOUSLY INTEGRATED PHOTONIC CIRCUIT AND METHOD FOR MANUFACTURING THE CIRCUIT

CROSS-REFERENCE TO RELATED APPLICATIONS

This application is a divisional application of U.S. patent application Ser. No. 16/366,534 filed on Mar. 27, 2019, which claims priority to Korean Patent Application No. 10-2018-0035740 filed on Mar. 28, 2018, which are incorporated herein in their entirety by reference for all purposes.

TECHNICAL FIELD

The present disclosure relates to a heterogeneously integrated photonic circuit and a method for manufacturing the same. More specifically, the present disclosure relates to a heterojunction circuit in which a semiconductor device and a photonic network including different materials are bonded and a method for manufacturing the same.

BACKGROUND ART

With the advent of the information age, the importance of electronic devices in the industry or daily life is gradually on the rise. Accordingly, the amount of information transmitted and received through electronic devices also increases. Electronic devices may use various technologies for transmission and reception of information. For example, electronic devices may transmit and receive information through communication using light, i.e., optical communication.

Optical communication may refer to a communication method in which transmission and reception of information is performed through optical signals. When using optical communication, electronic devices may convert an optical signal into an electrical signal, thereby finally acquiring the information included in the optical signal. Meanwhile, for optical communication, optical fibers for transmitting and receiving optical signals are required. The optical fibers may include fibrous waveguides for transmitting light. Waveguides on chips (semiconductor chips, or microchips) may be made of materials which allow high-speed communication, for example, silicon which is a material causing little interference. In this case, since silicon is an indirect band-gap material, it may have low luminous efficiency which results in restricting the efficiency of light sources or photodetectors. Accordingly, in order to improve the luminous efficiency, a heterojunction with a direct band-gap material may be required. Heterojunction may be performed by various methods. For example, heterojunction may be performed by partially growing a direct band-gap material on an indirect band-gap material. Because of large mismatches in lattice constants and thermal expansion coefficients between multiple semiconductor materials, the heterojunction would require a lot of time and high costs for large-area epitaxial growth.

SUMMARY

The present disclosure relates to a heterojunction circuit produced by efficiently bonding materials having different properties using microbubbles and a method for manufacturing the same. Additionally, the present disclosure relates to a heterojunction circuit with minimized wiring length by arranging a semiconductor which includes an electrode at a lower end thereof on an electrode of a silicon waveguide, and a method for manufacturing the same.

Meanwhile, the objectives of the present disclosure are not limited to those mentioned above. Additionally, the present disclosure may include objectives which were not mentioned but could be clearly understood by a person having an ordinary skill in the technical field to which the present disclosure belongs from the following descriptions.

In accordance with an aspect, there is provided a method for manufacturing a heterojunction circuit, comprising: depositing a first electrode on at least a part of a waveguide; moving a semiconductor comprising a second electrode at a lower end thereof onto the first electrode; and depositing a third electrode on an upper end of the semiconductor, wherein the waveguide and the semiconductor comprise different materials.

The moving the semiconductor comprising: generating microbubbles by supplying heat to at least a part of the semiconductor; moving the semiconductor onto the first electrode by moving the generated microbubbles; and removing the microbubbles by positioning the semiconductor on the first electrode.

The generated microbubbles may be moved in response to movement of a heat source which applies heat to the semiconductor, and the removing the microbubbles may comprise removing the microbubbles by stopping the supply of heat.

The microbubbles may be generated at the upper end of the semiconductor to be bonded to the semiconductor.

The first electrode may comprise a first area and a second area, and the semiconductor may be moved to be positioned on the first area, and the method may further comprise: depositing a fourth electrode on the second area.

The first electrode may comprise a first area on which the semiconductor is positioned, and a second area and a third area distinguished from the first area, the first area and the second area may be connected by the third area, and a fourth electrode may be deposited on an upper end of the second area.

The first electrode, the second electrode, the third electrode, and the fourth electrode may comprise the same material. Further, the first electrode and the second electrode may be connected, and the first electrode and the fourth electrode may be connected, so that the second electrode and the fourth electrode may be electrically connected.

The heterojunction circuit may further comprise an oxide film which is positioned on an upper end of at least a part of the waveguide and separated by a predetermined distance from the first electrode, and at least a part of the third electrode and at least a part of the fourth electrode may be positioned on an upper end of the oxide film.

A shape of the first area may correspond to a shape of the second electrode.

The waveguide may comprise silicon, and the semiconductor may comprise a group III-V compound semiconductor.

In accordance with another aspect, there is provided a heterojunction circuit, comprising: a waveguide comprising silicon; a first electrode deposited on at least a partial area of the waveguide; a semiconductor which comprises a second electrode at a lower end thereof and is positioned so that the second electrode is adjacent to the first electrode; and a third electrode deposited on an upper end of the semiconductor, wherein the semiconductor and the silicon comprise different materials.

The first electrode may comprise a first area on which the semiconductor is positioned, and a second area and a third area distinguished from the first area, the first area and the second area may be connected by the third area, and a fourth electrode may be deposited on an upper end of the second area.

The first electrode, the second electrode, the third electrode, and the fourth electrode may comprise the same material. Further, the first electrode and the second electrode may be connected, and the first electrode and the fourth electrode may be connected, so that the second electrode and the fourth electrode may be electrically connected.

The heterojunction circuit may further comprise an oxide film which is positioned on an upper end of at least a part of the waveguide and separated by a predetermined distance from the first electrode, and at least a part of the third electrode and at least a part of the fourth electrode may be positioned on an upper end of the oxide film.

A shape of the first area may correspond to a shape of the second electrode.

The semiconductor may comprise a group III-V compound semiconductor.

The heterojunction circuit according to one embodiment of the present disclosure and a method for manufacturing the same may provide a heterojunction circuit with minimized wiring length by bonding a semiconductor device and a silicon waveguide including different materials using microbubbles.

The effects which could be obtained in the present disclosure are not limited to those mentioned above, and other effects which are not mentioned could be clearly understood by a person skilled in the art from the following descriptions.

BRIEF DESCRIPTION OF THE DRAWINGS

FIGS. 5A to 5C illustrate an example of the constitution of the heterojunction circuit according to each step in the method for manufacturing the heterojunction circuit using microbubbles according to one embodiment of the present disclosure;

FIGS. 6A to 6C illustrate an example of generating microbubbles according to one embodiment of the present disclosure;

FIGS. 7A and 7B illustrate an example for explaining the heterojunction circuit manufactured according to one embodiment of the present disclosure;

DETAILED DESCRIPTION OF THE EMBODIMENTS

The advantages and features of the present disclosure and the methods of accomplishing these will be clearly understood from the following description taken in conjunction with the accompanying drawings. However, embodiments are not limited to those embodiments described, as embodiments may be implemented in various forms. It should be noted that the present embodiments are provided to make a full disclosure and also to allow those skilled in the art to know the full range of the embodiments. Therefore, the embodiments are to be defined only by the scope of the appended claims.

In describing the embodiments of the present disclosure, if it is determined that detailed description of related known components or functions unnecessarily obscures the gist of the present disclosure, the detailed description thereof will be omitted. Further, the terminologies to be described below are defined in consideration of functions of the embodiments of the present disclosure and may vary depending on a user's or an operator's intention or practice. Accordingly, the definition thereof may be made on a basis of the content throughout the specification.

Figure 1:
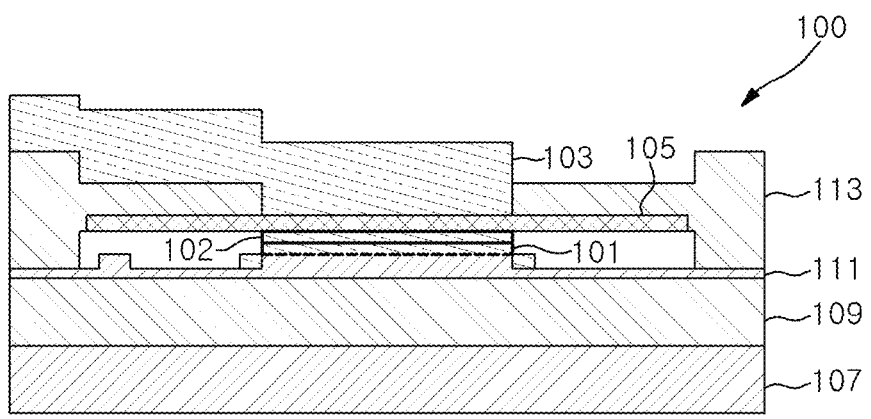
FIG. 1 illustrates an example of the configuration of a heterojunction circuit according to one embodiment of the present disclosure.

FIG. 1 illustrates an example of the configuration of a heterojunction circuit according to one embodiment of the present disclosure. FIG. 1 illustrates an example of a cross-section of the heterojunction circuit 100. Meanwhile, the heterojunction circuit 100 in FIG. 1 is merely one embodiment of the present disclosure, and thus the present disclosure is not limited to FIG. 1.

When referring to FIG. 1, the heterojunction circuit 100 may comprise supporters in a semiconductor substrate, a semiconductor (a semiconductor device, a micro-disk, or a light source/a photodetector) 105, and/or electrodes 101, 102, 103.

The supporters in the semiconductor substrate may comprise a silicon (Si) substrate (or a wafer) 107 on which an oxide film 109 is formed. The oxide film 109 may be formed of silicon dioxide (hereinafter, "$SiO_2$"), and the silicon substrate 107 may be formed of silicon. The supporters in the semiconductor substrate may comprise silicon (or silicon film) 111 and/or an oxide film 113 on an upper end of the oxide film 109. The silicon 111 may be generated by depositing silicon on an upper end of the oxide film 109, and etching the deposited silicon in the same shape as the silicon 111 in FIG. 1. The oxide film 113 may be generated by depositing $SiO_2$ on an upper end of the silicon 111. The thickness of $SiO_2$ (e.g., 2 μm) deposited on an upper end of the silicon 111 may vary depending on the embodiments. The oxide film 113 may be generated by etching $SiO_2$ deposited on an upper end of the silicon 111.

Silicon 111 has low interference, and thus may enable high-speed transmission of optical signals. Accordingly, silicon 111 may be used as a material of a waveguide for high-speed optical communication. In optical communication, the waveguide may serve as a passage for transmitting and receiving optical signals.

Hereinafter, in the present disclosure, the waveguide may refer to a part in the supporters in the semiconductor substrate having a carved (or groove) shape. Meanwhile, in the embodiment, since the silicon 111 is an indirect band-gap material, when electrons and holes are coupled, an energy corresponding to the band-gap of the silicon 111 may be consumed as heat or vibration.

The oxide film 113 may be separated by a predetermined distance from the first electrode 101 and may be positioned on an upper end of at least a part of the waveguide.

The supporters in the semiconductor substrate may include basic elements of a semiconductor circuit for implementing silicon photonics technologies. Meanwhile, the supporters in the semiconductor substrate are not limited to the above-mentioned examples.

The semiconductor 105 may include a compound semiconductor (or a group III-V compound semiconductor). For example, the semiconductor 105 may be a semiconductor formed of at least one of indium (In), gallium (Ga) and arsenic (As). As another example, the semiconductor 105 may be a compound semiconductor formed of InGaAs. This semiconductor 105 may be a direct band-gap semiconductor. When electrons and holes are coupled, the direct band-gap semiconductor may include a semiconductor which emits energy in the form of light. The energy may include an energy corresponding to the band-gap of the semiconductor 105.

The electrodes may include a first electrode 101, a second electrode 102, and a third electrode 103. The first electrode 101 may include an electrode wired in at least a part of an upper end of the waveguide. The second electrode 102 may include an electrode positioned on (or attached to) a lower end of the semiconductor 105. According to the embodiments, as illustrated in FIG. 1, the width of the second electrode 102 is smaller than that of the semiconductor 105, and may correspond to that of the first electrode 101. Meanwhile, the width of the second electrode 102 is not limited to the above-mentioned examples, but may have various sizes as long as the second electrode 102 could be positioned on top of the first electrode 101 or on the lower end of the semiconductor 105. The third electrode 103 may be generated based on a metallization process.

The thicknesses of the first electrode 101, the second electrode 102, and the third electrode 103 may be different. For example, the thickness of the first electrode 101 may be 200 nm, the thickness of the second electrode 102 may be 100 nm, and the thickness of the third electrode 103 may be 1.5 μm.

The first electrode 101, the second electrode 102, and the third electrode 103 may have different thicknesses depending on the materials included therein. For example, when the first electrode 101 includes titanium (Ti), the thickness of the first electrode 101 may be 20 nm, and when the first electrode 101 includes gold (Au), the thickness of the first electrode 101 may be 200 nm. As another example, when the second electrode 102 includes titanium, the thickness of the second electrode 102 may be 7 nm, and when the second electrode 102 includes gold, the thickness of the second electrode 102 may be 100 nm. As yet another example, when the third electrode 103 includes titanium, the thickness of the third electrode 103 may be 10 nm, and when the third electrode 103 includes gold, the thickness of the third electrode 103 may be 1.5 μm. The materials constituting the first electrode 101, the second electrode 102, and the third electrode 103 are not limited to the above-mentioned examples, but may include various materials which could be used as the electrode.

The heterojunction circuit 100 may include an indirect band-gap material (e.g., silicon 111) and a direct band-gap material (e.g., semiconductor 105). Specifically, the heterojunction circuit 100 may have a structure in which an indirect band-gap material and a direct band-gap material are bonded. For example, the heterojunction circuit 100 may include the silicon 111 and the semiconductor 105 which are bonded (or coupled) to each other. According to the embodiments, the indirect band-gap material and direct band-gap material may be bonded to each other having electrodes positioned therebetween. For example, the semiconductor 105 and the silicon 111 may be bonded to each other having the first electrode 101 and the second electrode 102 positioned therebetween. The heterojunction circuit 100 including the silicon 111 and a semiconductor 105 which are bonded to each other may supplement the properties of the silicon 111 as an indirect band-gap material. For example, the heterojunction circuit 100 may supplement the low luminous efficiency of the silicon 111 by using the semiconductor 105 with high luminous efficiency.

The heterojunction circuit 100 may include electrodes on an upper end and a lower end of the semiconductor 105. Specifically, the heterojunction circuit 100 may include a third electrode 103 on the upper end of the semiconductor 105, and may include the second electrode 102 and the first electrode 101 on the lower end of the semiconductor 105. The first electrode 101 may be bonded to the second electrode 102 to operate as one electrode. Due to the electrodes directly connected to the upper end and the lower end of the semiconductor 105, the heterojunction circuit 100 does not need an additional wiring. In other words, the heterojunction circuit 100 of the present disclosure may include minimized electrode wiring. Due to the electrode wiring with minimized length, the heterojunction circuit 100 may have a fast response speed in relation to detecting optical signals.

Figure 3C:
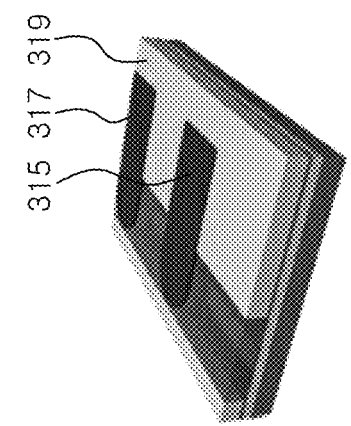
FIGS. 3A to 3C illustrate an example of the configuration of the circuit according to each step in the method for manufacturing the heterojunction circuit according to one embodiment of the present disclosure.
Figure 3B:
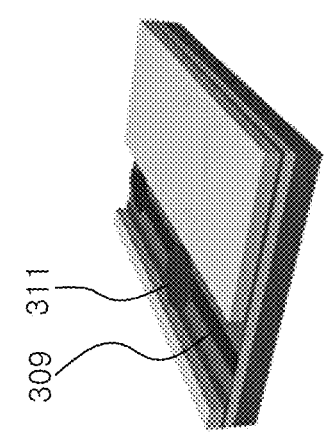
Figure 3A:
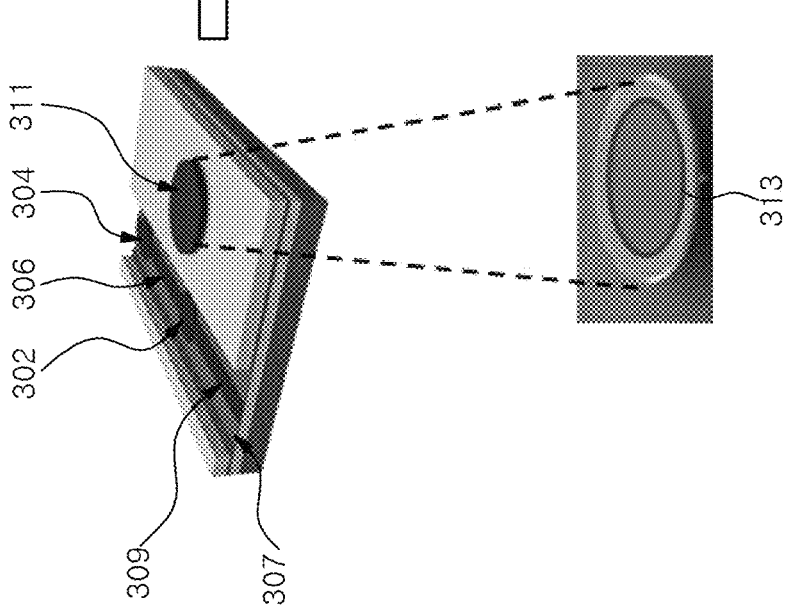

Although it is not illustrated, the first electrode 101 positioned on the lower end of the semiconductor 105 may be wired linearly along the length of the waveguide on at least a part of the silicon 111 constituting the waveguide. The semiconductor 105 may be positioned on at least a part of the first electrode 101. The first electrode 101 may include a part (or an area) on which the semiconductor 105 is positioned or a part on which the semiconductor 105 is not positioned. The part of the first electrode 101 on which the semiconductor 105 is not positioned may be connected to another electrode. By such a connection, the first electrode 101 may be extended to be positioned on the same plane as the third electrode 103. The first electrode 101 and the other electrode of the part on which the semiconductor 105 is not positioned may be bonded to each other to operate as one electrode. Explanation in relation with this configuration will be described later with reference to FIGS. 3A to 3C.

Figure 2:
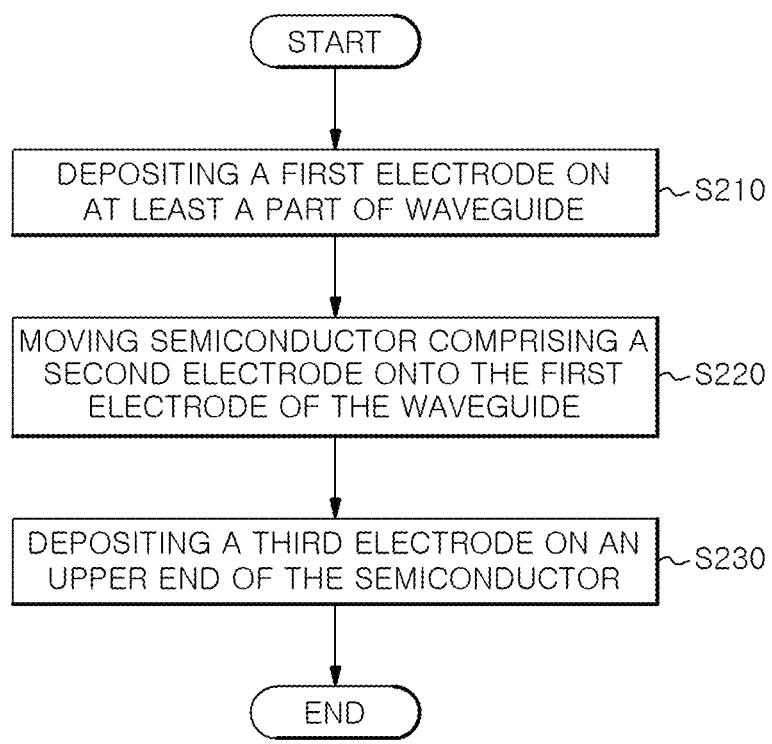
FIG. 2 illustrates an example of a method for manufacturing a heterojunction circuit according to one embodiment of the present disclosure.

FIG. 2 illustrates the steps in the method for manufacturing the heterojunction circuit 100 in which the semiconductor and waveguide comprising different materials are bonded to each other according to one embodiment of the present disclosure. The operation which will be mentioned later may be performed by a semiconductor device or an electronic device, and since this operation may be easily achieved by a person skilled in the art, detailed description thereon will be omitted.

Referring to FIG. 2, the method for manufacturing the heterojunction circuit 100 may comprise a step of depositing a first electrode 101 on at least a part of a waveguide (S210). In some embodiments, the first electrode 101 may be deposited (or wired, or generated) linearly along the length of the waveguide. In other embodiments, the first electrode 101 may be generated by depositing the electrode on silicon 111, and then etching the deposited electrode to have a linear shape extending in the longitudinal direction of the waveguide.

The method for manufacturing the heterojunction circuit 100 may comprise a step of moving a semiconductor 105 comprising a second electrode 102 at a lower end thereof onto the first electrode 101 of the waveguide (S220). A semiconductor 311 including the second electrode 102 at a lower end thereof may be moved to a designated area of the first electrode 101. The second electrode 102 at a lower end of the semiconductor 105 may be attached on the designated area of the first electrode 101. The attachment between the second electrode 102 and the first electrode 101 may be made by the attraction formed by Van der Waals force.

The method for manufacturing the heterojunction circuit 100 may comprise a step of depositing a third electrode 103 on an upper end of the semiconductor 105 (S230). The third electrode 103 may be deposited on the upper end of the semiconductor 105 positioned on a designated area of the waveguide. Although it is not illustrated, the step (S230) may comprise a step of depositing the third electrode 103 on an upper end of another designated area of the first electrode.

FIG. 3 illustrates an example of the configuration of the circuit according to each step in the method for manufacturing the heterojunction circuit according to one embodiment of the present disclosure.

Referring to FIG. 3, a first electrode 309 (e.g., the first electrode 101 in FIG. 1) may be wired on a silicon 307 (e.g., silicon 111 in FIG. 1) of the waveguide. The first electrode 309 may be wired linearly in the longitudinal direction of the waveguide. The first electrode 309 may comprise a first area 302 having a similar shape to the shape of a semiconductor 311 (e.g., the semiconductor 105 in FIG. 1). For example, the first electrode 309 may comprise a circular first area 302 which has the same shape as the circular semiconductor 311. According to the embodiments, the first electrode 309 may comprise a second area 304 which is separated from the first area 302. The first area 302 and the second area 304 may be connected by a third area 306. The third area 306 may comprise a part of the first electrode 309 wired in a linear shape between the first area 302 and the second area 304. The first area 302, the second area 304, and the third area 306 may have various shapes, and the shapes thereof are not limited to the illustrated examples.

The semiconductor 311 may comprise a second electrode 313 (e.g., the second electrode 102) at a lower end thereof. The second electrode 313 may be attached or bonded to the lower end of the semiconductor 311. The second electrode 313 may be an electrode generated by an additional process. For example, the second electrode 313 may be an electrode which is generated by an additional apparatus for generating the second electrode, and is then attached to the semiconductor 311. The second electrode may be generated by an additional process before or simultaneously with the step of manufacturing the heterojunction circuit 100.

The second electrode 313 may have various shapes. For example, the second electrode 313 may have a shape (e.g., circular shape) corresponding to the semiconductor 311. As another example, the second electrode 313 may have a different shape (e.g., square shape) which is smaller than the semiconductor 311. As yet another example, the second electrode 313 may have a shape which is smaller than the semiconductor 311 and corresponds to the shape of the semiconductor 105. Meanwhile, the shapes of the second electrode 313 are not limited to the above-mentioned examples, but the second electrode 313 may have various shapes as long as it could be bonded (or easily bonded) to the first area 302.

The semiconductor 311 may be moved onto the first area 302 of the first electrode 309. As the semiconductor 311 moves onto the first area 302, a circuit hetero-bonded with a part of the waveguide (e.g., silicon 307) may be formed. Explanation on the movement of the semiconductor 311 on the first electrode 309 will be described later with reference to FIGS. 4 to 6.

A third electrode 315 may be deposited on an upper end of the semiconductor 311. A part of the third electrode 315 may be positioned on the upper end of the semiconductor 311, and another part of the third electrode 315 may be positioned on an upper end of an oxide film 319. In some cases, a fourth electrode 317 may be deposited on an upper end of the second area 304 of the first electrode 309. A part of the fourth electrode 317 may be positioned on the upper end of the second area 304 of the first electrode 309, and another part of the fourth electrode 317 may be positioned on the upper end of the oxide film 319. In this case, the fourth electrode 317 may be positioned on the same plane as the third electrode 315. The fourth electrode 317 may be a part which is extended in order to use the first electrode 309 bonded to the lower end of the semiconductor 311. The fourth electrode 317, for example, may be an extension of the first electrode 309 for providing a specific signal (e.g., an optical signal or an electrical signal) to the first electrode 309 or for detecting the same. The fourth electrode 317 is connected to the first electrode 309 to operate as one electrode with the first electrode 309. In other words, the first electrode 309 and the fourth electrode 317 may be driven as one electrode during the operation of the heterojunction circuit 100.

As the electrode is connected to the upper end and the lower end of the semiconductor 311, the wiring length of the heterojunction circuit 100 may be minimized. As the wiring length is minimized, the moving distance between the electrons and/or holes of the heterojunction circuit 100 may be minimized. Accordingly, the time constant (or RC time constant), and/or the transition time of the heterojunction circuit 100 may be improved. Additionally, as the wiring length is minimized, the heterojunction circuit 100 may have a high level of responsivity (or a fast response speed) or a low level of dark current. When the heterojunction circuit 100 has a low level of dark current, a photodetector using the heterojunction circuit 100 may detect small optical signals while maintaining linearity.

Figure 4:
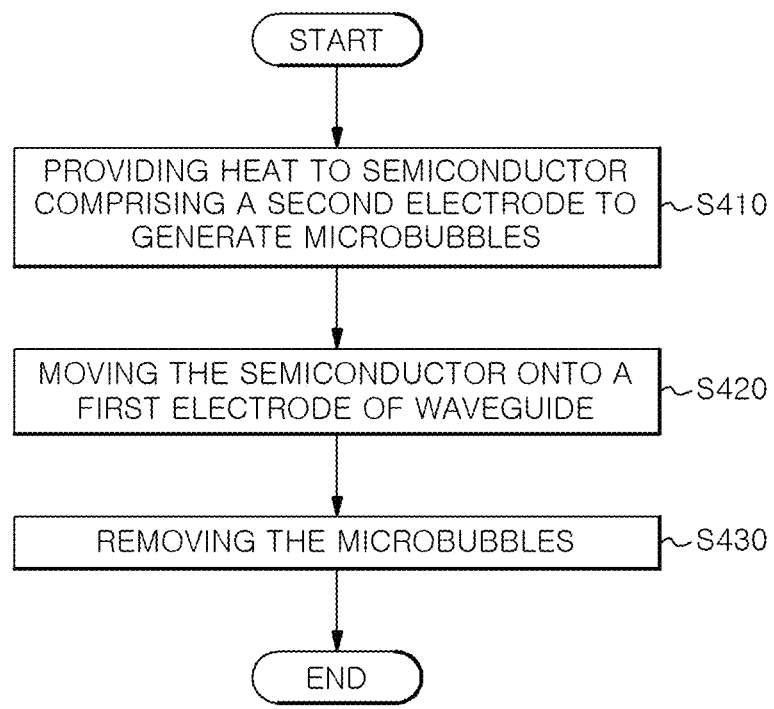
FIG. 4 illustrates an example of a method for manufacturing the heterojunction circuit using microbubbles according to one embodiment of the present disclosure.

FIG. 4 illustrates an example of the method for manufacturing the heterojunction circuit using microbubbles according to one embodiment of the present disclosure. FIG. 4 illustrates an example of the method for moving the semiconductor 311 onto the first electrode 309 using microbubbles. The operation which will be mentioned later may be conducted by a semiconductor device or an electronic device, and any explanation overlapping with FIG. 2 or 3 will be omitted.

According to one embodiment, the operation for generating microbubbles or the operation using microbubbles may be conducted in water. For example, the following operations could be conducted while the circuit for heterojunction and the semiconductor (e.g., semiconductor 311) for heterojunction are put in water.

Referring to FIG. 4, the method for manufacturing the heterojunction circuit 100 may comprise a step of providing heat to the semiconductor 311 to generate microbubbles (S410). The method for manufacturing the heterojunction circuit 100 may supply heat to at least a part of the semiconductor 311 by using a heat supply device as a heat source. The heat supply device may include, for example, a laser. When heat is supplied to the semiconductor 311, microbubbles may be generated at an upper end of the semiconductor 311. FIGS. 5A to 5C or FIGS. 6A to 6C may be referred to as examples in relation with the generation of microbubbles.

The method for manufacturing the heterojunction circuit 100 may comprise a step of moving the semiconductor 311 onto the first electrode 309 of the waveguide (S420). Microbubbles may be moved by the movement of the supplied heat. As the microbubbles move, the microbubbles and the semiconductor 311 attached thereto may be moved together. In other words, as heat is moved on the first electrode 309, the microbubbles and the semiconductor 311 attached to the microbubbles could be moved onto the first electrode 309. The semiconductor 311 positioned on the first electrode 309 may be connected (or bonded) to the first electrode 309 as the second electrode 313 attached to the lower end of the semiconductor 311 is in contact with the first electrode 309. For example, the second electrode 313 may be put on the upper end of the first electrode 309 to be connected to the first electrode 309. The second electrode 313 may operate as the first electrode 309 by being connected to the first electrode 309. In other words, the first electrode 309 and the second electrode 313 may be driven as one electrode during the operation of the heterojunction circuit 100.

The method for manufacturing the heterojunction circuit 100 may comprise a step of removing the microbubbles (S430). As the semiconductor 311 is positioned on the upper end of the first electrode 309, the microbubbles can be removed. The microbubbles can be removed by stopping the supply of heat to the semiconductor 311. FIGS. 5A to 5C may be referred to as an explanation on the removal of microbubbles.

FIGS. 5A to 5C illustrate an example of the configuration of the heterojunction circuit according to each step in the method for manufacturing the heterojunction circuit using microbubbles according to one embodiment of the present disclosure.

Referring to FIGS. 5A to 5C, microbubbles 520 may be generated as heat 510 is supplied to the top of the semiconductor 311. While microbubbles 520 are generated on the top of the semiconductor 311, the microbubbles 520 may be coupled to the semiconductor 311. In this case, the semiconductor 311 may comprise the second electrode 313 at a lower end thereof. The second electrode 313 may be generated and attached to the semiconductor 311 in advance. FIGS. 6A to 6C may be referred to as detailed description on the generation of microbubbles 520.

When the semiconductor 311 is positioned on the first electrode 309, the supply of heat 510 may be stopped. As the supply of heat 510 is stopped, the size of the microbubbles 520 is reduced gradually. The microbubbles may extinguish as a predetermined time passes after the supply of heat is stopped. As the supply of heat 510 is stopped and the microbubbles 520 are removed, only the semiconductor 311 may be positioned on the first electrode 209.

FIGS. 6A to 6C illustrate an example of generating the microbubbles according to one embodiment of the present disclosure.

When referring to FIG. 6, heat 510 may be supplied to a part of the upper end of the semiconductor 311. In accordance with the supply of heat, the microbubbles 520 are generated, and a convectional flow (e.g., thermos-capillary phenomenon) may occur around the boundary between the semiconductor 311 and water. Due to the convectional flow generated, the semiconductor 311 may be coupled (or attached) to the microbubbles 520. Heat 510 may be supplied continuously, and in this case, the semiconductor 311 may be moved to a place where the temperature is high according to the movement of heat 510.

The semiconductor 311 may be formed of InGaAsP (or a compound semiconductor). In this case, the semiconductor 311 may efficiently convert the supplied heat into thermal energy. Accordingly, even if there is no absorption layer (or a metal layer, or a dielectric layer) for converting optical energy of the heat source into thermal energy, the microbubbles 520 may be generated as heat is supplied. Since there is no absorption layer, the heterojunction circuit 100 does not have to put up with optical loss which may be caused by the absorption layer in the step of implementing the photonic circuit after heterojunction.

FIGS. 7A and 7B illustrate an example for explaining the heterojunction circuit manufactured according to one embodiment of the present disclosure.

Referring to FIG. 7A, in one embodiment, a circuit 701 represents a heterojunction circuit in which a semiconductor (e.g., the semiconductor 105 in FIG. 1) is bonded to a single-mode waveguide. The graph 702 represents the grating coupler output power of the circuit 701 according to wavelength. The grating coupler output power may include the strength of the optical signal output by using a grating coupler. The graph 702 shows that a whispering gallery mode excited by optical pumping could be delivered well through the single-mode waveguide. The whispering gallery mode may include the light which stays in a circular optical resonator for a long time.

Referring to FIG. 7B, in one embodiment, a circuit 703 represents a heterojunction circuit in which the semiconductor is hetero-bonded with a multi-mode waveguide. The graph 704 represents the grating coupler output power of the circuit 703 according to wavelength. The graph 704 shows that a whispering gallery lasing mode excited by optical pumping could be delivered well through the multi-mode waveguide.

Figure 8B:
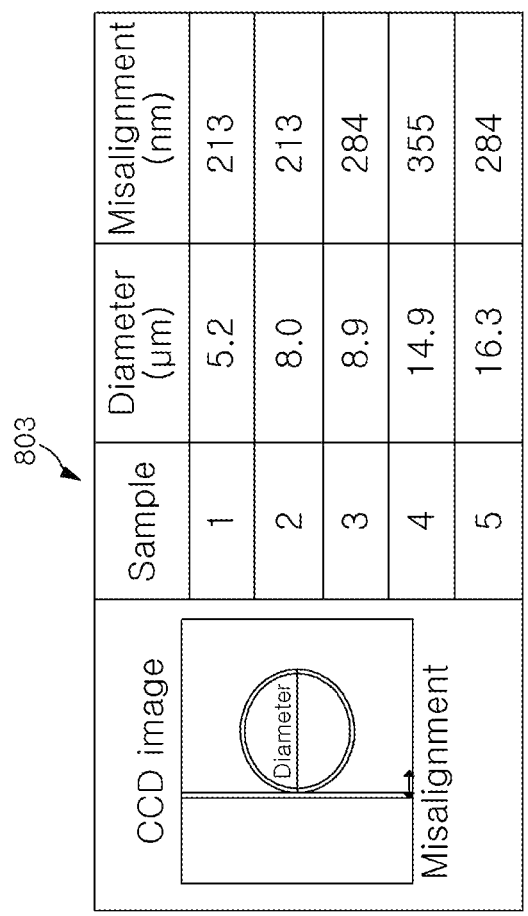
FIGS. 8A and 8B illustrate an example for explaining the effect of the heterojunction circuit manufactured according to one embodiment of the present disclosure.
Figure 8A:
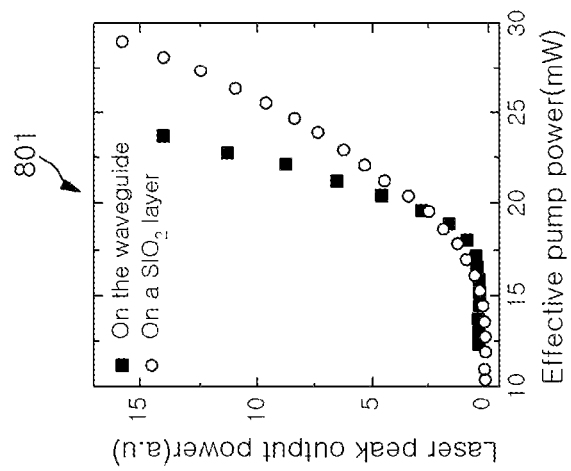

FIGS. 8A and 8B illustrate an example for explaining the effect of the heterojunction circuit manufactured according to one embodiment.

Referring to FIGS. 8A and 8B, in one embodiment, the graph 801 may represent a maximum output power of an optical signal before and after using microbubbles (e.g., microbubbles 520 of FIGS. 5A to 5C) according to an effective pump power of the optical signal provided to the heterojunction circuit. The effective pump power may be a term indicating an optical signal which is substantially injected in the heterojunction circuit among the optical signals provided in the experiment. The maximum output power of the optical signal may be a term indicating a maximum value among the output power of the optical signal output through the waveguide after optical signals flow in the heterojunction circuit.

The maximum output power of the optical signal before using microbubbles may be the maximum output power of the optical signal output before adjusting the semiconductor (e.g., semiconductor 105 of FIG. 1) using the microbubbles, that is, the maximum output power of the optical signal output when providing the optical signal on $SiO_2$. The maximum output power of the optical signal after using microbubbles may be the maximum output power of the optical signal output after adjusting the semiconductor using the microbubbles, that is, the maximum output power of the optical signal when providing the optical signal to the semiconductor coupled to the waveguide. The graph 801 shows that the physical damage may not occur in the semiconductor and/or waveguide in the process of moving the semiconductor by the microbubbles. The microbubbles move the semiconductor using an indirect force generated by the heat, thereby preventing damages (or scratches) to the semiconductor and/or waveguide.

The table 803 in FIG. 8B represents an alignment error according to the type and/or size of the semiconductor according to one embodiment of the present disclosure. Referring to table 803, the semiconductor may have various sizes. The semiconductor may, for example, include a semiconductor having a predetermined diameter of 5 μm or more and 16 μm or less. The semiconductors having different sizes may have a misalignment. The misalignment may be, for example, 213 nm or 284 nm. Meanwhile, it may be known that the misalignment exists within a predetermined size of error (e.g., 500 nm or less). In other words, it may be known that the heterojunction circuit according to one embodiment of the present disclosure is manufactured with low misalignment and with high accuracy.

Figure 9A:
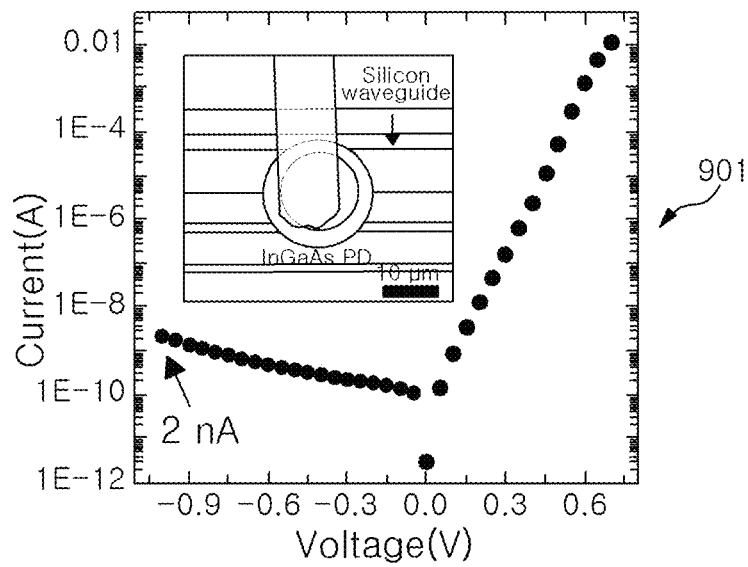
FIGS. 9A to 9C illustrate another example for explaining the effect of the heterojunction circuit according to one embodiment of the present disclosure.
Figure 9B:
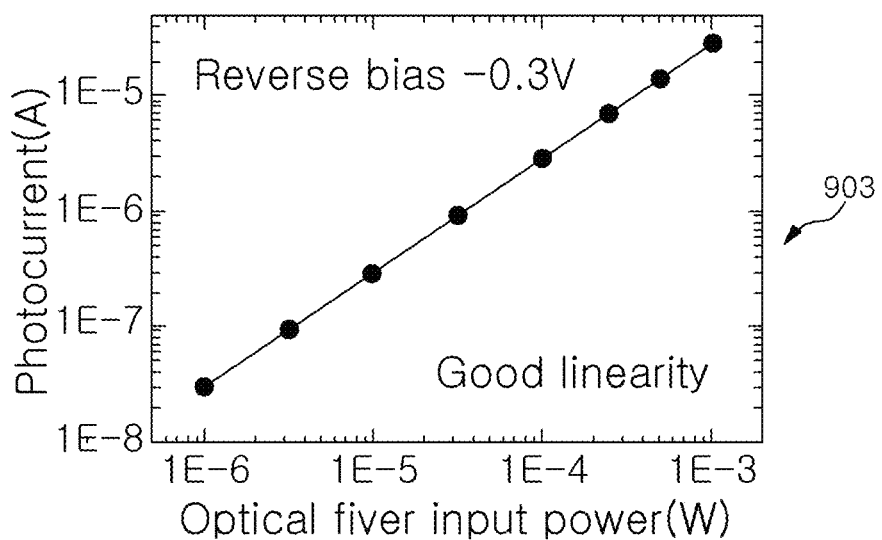
Figure 9C:
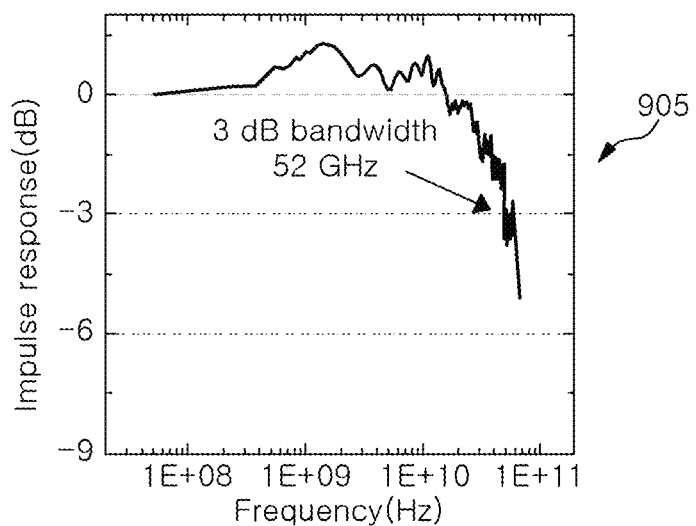

FIGS. 9A to 9C illustrate another example for explaining the effect of the heterojunction circuit according to one embodiment. FIGS. 9A to 9C illustrate the result of an experiment performed to confirm the property of the heterojunction circuit according to one embodiment of the present disclosure.

Referring to the graph 901 in FIG. 9A, it may be known that the heterojunction circuit has a very low dark current of about 2 nA up to a backward voltage of −1 V.

When referring to the graph 903 in FIG. 9B, it may be known that the heterojunction circuit may detect a small optical signal, for example, an optical signal of 1 μW while maintaining linearity.

The graph 905 in FIG. 9C represents a result of measuring radio frequency (RF) response. According to the graph 905, it may be known that the 3 dB bandwidth of the heterojunction circuit is 52 GHz, which is a very fast response speed. Additionally, although it is not illustrated, the heterojunction circuit may obtain a clear eye diagram for a 50 Gb/s non-return-to-zero (NRZ) signal. Through the above, it may be known that the heterojunction circuit may deliver the optical signal clearly.

According to FIGS. 9A to 9C, the heterojunction circuit has an improved RC time constant and/or transition time by minimizing the moving distance of the electrons and holes compared to a mesa electrode structure which was conventionally used.

As described above, those skilled in the art will understand that the present disclosure can be implemented in other forms without changing the technical idea or essential features thereof. Therefore, it should be understood that the above-described embodiments are merely examples, and are not intended to limit the present disclosure. The scope of the present disclosure is defined by the accompanying claims rather than the detailed description, and the meaning and scope of the claims and all changes and modifications derived from the equivalents thereof should be interpreted as being included in the scope of the present disclosure.

What is claimed is:

1. A heterojunction circuit, comprising:
a waveguide including silicon;
a first electrode deposited on at least a partial area of the waveguide;
a second electrode adjacent to the first electrode;
a semiconductor to which the second electrode attached at a lower end thereof, the second electrode being disposed beneath the semiconductor; and
a third electrode deposited on an upper end of the semiconductor,
wherein the semiconductor and the silicon comprise different materials.

2. The heterojunction circuit of claim 1, wherein the first electrode comprises a first area on which the semiconductor is positioned, and a second area and a third area distinguished from the first area,
the first area and the second area are connected by the third area, and
a fourth electrode is deposited on an upper end of the second area.

3. The heterojunction circuit of claim 2, wherein the first electrode, the second electrode, the third electrode, and the fourth electrode comprise the same material, and
the first electrode and the second electrode are connected, and the first electrode and the fourth electrode are connected, so that the second electrode and the fourth electrode are electrically connected.

4. The heterojunction circuit of claim 2, wherein the heterojunction circuit further comprises an oxide film which is positioned on an upper end of at least a part of the waveguide and separated by a predetermined distance from the first electrode, and
at least a part of the third electrode and at least a part of the fourth electrode are positioned on an upper end of the oxide film.

5. The heterojunction circuit of claim 2, wherein a shape of the first area corresponds to a shape of the second electrode.

6. The heterojunction circuit of claim 2, wherein the semiconductor comprises a group III-V compound semiconductor.

7. The heterojunction circuit of claim 1, wherein the first electrode and the second electrode are deposited between the semiconductor and the waveguide.

* * * * *